United States Patent [19]

Yamazaki

[11] Patent Number: 5,364,835
[45] Date of Patent: Nov. 15, 1994

[54] METHOD OF ADDING A HALOGEN ELEMENT INTO OXIDE SUPERCONDUCTING MATERIALS BY ION INJECTION OR THERMAL DIFFUSION

[75] Inventor: Shunpei Yamazaki, Tokyo, Japan

[73] Assignee: Semiconductor Energy Laboratory Co., Ltd., Kanagawa, Japan

[21] Appl. No.: 22,440

[22] Filed: Feb. 16, 1993

Related U.S. Application Data

[60] Continuation of Ser. No. 463,920, Jan. 10, 1990, abandoned, which is a division of Ser. No. 190,352, May 5, 1988, Pat. No. 4,916,116.

[30] Foreign Application Priority Data

May 6, 1987 [JP] Japan ................................ 62-111614
Jun. 1, 1987 [JP] Japan ................................ 62-138580

[51] Int. Cl.$^5$ ........................... B05D 3/06; B05D 5/12
[52] U.S. Cl. ..................................... 505/461; 505/730; 505/731; 505/785; 427/62; 427/529; 427/126.3
[58] Field of Search .................... 505/1, 730, 731, 785; 427/62, 63, 126.3, 529; 204/192.24; 437/240

[56] References Cited

U.S. PATENT DOCUMENTS 4,567,061  1/1986  Hayashi et al. .................. 437/240

FOREIGN PATENT DOCUMENTS 61-039321  2/1986  Japan .

OTHER PUBLICATIONS

Kawazaki et al., "Compositional and Structural analyses for Optimizing the Preparation conditions of superconducting $(La_{1-x}Sr_x)_yCuO_{4-\delta}$ films by sputtering" Jpn. J. Appl. Phys. 26(4) Apr. 1987, L388–390.
Politis et al., "Preparation and superconducting properties of $La_{1.8}Sr_{0.2}CuO_4$ and $YBa_2Cu_3O_{6.5}$" Extended Abstract, edited by Gubser et al., Apr. 1987, pp. 141–143.
Tonouchi et al., "Hall Coefficient of La–Sr–Cu Oxide Superconducting Compound", Jpn. J. Appl. Phys. 26(4) Apr. 1987, L519–520.

*Primary Examiner*—Roy V. King
*Attorney, Agent, or Firm*—Sixbey, Friedman, Leedom & Ferguson

[57] ABSTRACT

A method of producing an oxide superconducting material comprises the steps of adding a halogen element to an oxide superconducting material by ion injection and thermal diffusion, forming a film either on the oxide material before or after the adding step, and applying heat treatment after the forming step to improve the electric property in the near-surface portion.

20 Claims, 2 Drawing Sheets

METHOD OF ADDING A HALOGEN ELEMENT INTO OXIDE SUPERCONDUCTING MATERIALS BY ION INJECTION OR THERMAL DIFFUSION

This application is a continuation of Ser. No. 07/463,920, filed Jan. 10, 1990, now abandoned, which itself was a divisional of application Ser. No. 07/190,352, filed May 5, 1988, now U.S. Pat. No. 4,916,116.

FIELD OF THE INVENTION

This method relates to a method of producing an oxide superconducting material.

This invention improves the near-surface properties of an oxide superconducting material for use in a device which uses the surface of the superconducting material. In addition, for use in a device such as a superconducting magnet which uses the bulk (interior), this invention increases the stability, especially the stability with respect to oxygen vacancies.

BACKGROUND OF THE INVENTION

Recently, oxide superconducting materials have attracted a great deal of attention. This activity was started by the development of a Ba-La-Cu-O-type oxide superconducting material at IBM Zurich. In addition, yttrium-type oxide superconducting materials are known. It is clear that these have possible applications in solid state electronic devices at liquid nitrogen temperature.

Meanwhile, semiconductor materials containing metals, such as $Nb_3Ge$, are also well-known. Attempts have been made to use these metal superconducting materials in solid state electric devices such as Josephson elements.

After well over 10 years of research, Josephson elements containing these metal superconducting materials have almost reached the stage of practical application. However, these superconducting materials have a $T_{co}$ (temperature at which the electrical resistance becomes zero) of 23° K., which is very low, and so cannot be used without using liquid helium, which is not sufficiently practical.

Meanwhile, since these metal superconducting materials are made entirely of metals, their composition is uniform, both on the surface and in the interior (bulk).

However, when the characteristics of oxide superconducting materials, which have recently attracted attention, are investigated it is found that their near-surface characteristics (to a depth of about 200Å) are inferior (less reliable) compared to those in the interior in many cases.

Investigation of the properties of this material has shown that it has a $T_{co}$ of 90° K. to 100° K., and in addition, the electrical conductivity varies in the range of 150° K. to 270° K.

The cause of this is judged to be that the oxygen in an oxide superconducting material escapes into the air easily when it is near the surface. When the material is heated to 250° C. to 500° C., the oxygen escapes easily even from the interior, causing many oxygen vacancies to be produced. The term of "vacancy" is used to mean an opening where an atom is missing in the regular arrangement of atoms. Whether this oxygen is present in its full amount or insufficient is a critical factor in determining whether the material can be made superconducting or is simply an ordinary electrically conducting material.

This invention enables an oxide superconducting material to be superconducting both in the interior and near the surface, with an optimum density of oxygen vacancies, heat resistance and process resistance which means that the oxide superconducting material can be kept stable even in a vacuum.

Thus, by adding a halogen element to the vacancy, the oxide superconducting material becomes mechanically stronger, so that even if it is made into a thin film, it can be given a $T_{co}$ of 90° K. or higher. In particular, when it is formed by sputtering, in general it will be formed densely so that it is hard to produce a vacancy, but by adding fluorine to whatever vacancies do form before or at the same time as the thin films is formed, the film that is obtained is dense, heat-resistant and process-resistant.

SUMMARY OF THE INVENTION

The object of this invention is to provide a method to overcome the problems as mentioned above, in which a halogen element is added to the oxide superconducting material to fill part or all of the oxygen vacancies.

Another object of this invention is to provide a method in which, when the oxide superconducting material film is formed, sputtering is used, so that halogen elements added during the process fill part or all of the oxygen vacancies and cancel those vacancies.

DETAILED DESCRIPTION OF THE PREFERRED EMBODIMENTS

Figure 1A:
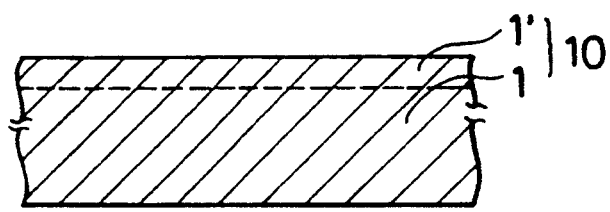
FIGS. 1(A), 1(B), 1(C), 1(D) and 1(E) show a production method of the present invention and a corresponding oxygen concentration distribution.
Figure 1B:
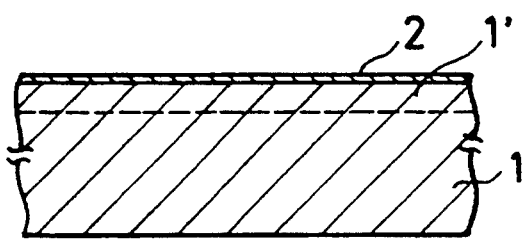
Figure 1C:
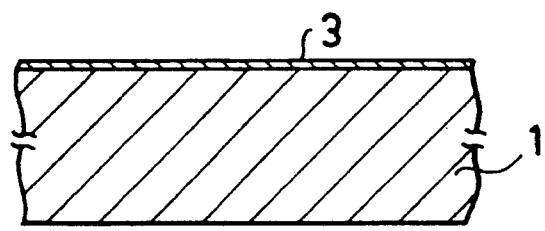

In one embodiment of the present invention, a halogen element is added to the oxide superconducting material to fill part or all of the oxygen vacancies. In particular, addition of a halogen element such as fluorine to a superconducting that has a certain number of oxygen vacancies and a maximum $T_{co}$ fills part or all of the vacancies, thus stabilizing the perovskite molecular structure. As a result it becomes heat-resistant and process-resistant This method is particularly effective for a thin film material that has a large surface area.

At the same time, this embodiment involves the simultaneous formation of a coating on the surface of the oxide superconducting material. Before or after this step, a halogen element, generally, fluorine, is added by a method such as ion injection or heat oxidation; then the whole superconducting material is heat-treated to set the added fluorine into the proper arrangement of atoms.

In addition, a more complete blocking layer is formed by heat-treating the coating and oxidated to produce an insulating film in the case of metal and semiconductor.

By causing solid-solid diffusion of the oxygen in the coating, that is oxygen diffusion from the solid coating into the oxide superconducting material which is also a solid, the oxygen density in the vicinity of the surface, generally to a depth of about 200Å can be adjusted to an appropriate value.

Coatings used for this purpose can be insulators such as silicon niride, aluminum nitride, aluminum oxide, tantalum oxide or tiatnium oxide.

A metal or semiconductor that becomes insulating after oxidation can also be used for this coating. Suitable metals include aluminum, titanium, tantalum, copper, barium and yttrium; while suitable semiconductors include silicon and germanium. These are oxidized to form, for example, aluminum oxide, titanium oxide, tantalum oxide, copper oxide, barium oxide or yttrium oxide. Silicon is oxidized to silicon oxide, germanium to germanium oxide.

The method of this invention is effective whether the oxide superconducting material is formed into a tablet or this film. Methods of forming a thin film include screen printing, sputtering, MBE (molecular beam epitaxy), CVO (chemical vapor deposition reaction) and photo CVD.

In another embodiment of this invention, when the target is sputtered and superconducting material flies off and forms on a surface to be coated, the gas which strikes this target has both oxygen and a halogen element added to the inert gas at the same time. This halogen-containing gas becomes a plasma, and the halogen element, for example fluorine, is added to the superconducting oxide material that is formed on the surface. After that the whole thing is heat-treated, and the added fluorine is embedded at the locations where vacancies were produced.

An oxide superconducting material has a molecular structure, for example, represented by $(A_{1-x} B_x)_y Cu_z O_w$, where $x=0$ to 1, $y=2.0$ to 4.0 and preferably 2.5 to 3.5, $z=1.0$ to 4.0 and preferably 1.5 to 3.5, and $w=4.0$ to 10.0 and preferably 6.0 to 8.0, and A is at least one element selected from Group IIIa of the Periodic Table, for example Y(yttrium), Gd(gadolinium), Yb(ytterbium), Eu(Europium), Tb(Terbium), Dy(Dysprosium), Ho(Holmium), Er(Erbium), Tm(Thulium), Lu(Lutetium), Sc(Scandium) or other lanthanides, and B is an element selected from Group IIIa of the Periodic Table, for example, Ba(barium) or St(strontium), Ca(calcium), Mg(Magnesium), Be(Beryllium).

Fluorine fills vacancies in the material most easily since it has the smallest atomic radius.

As a specific example, $(YBa_2)Cu_3O_{6-8}$ is used for the first embodiment. In addition, another lanthanide elements and actinide elements can be used.

As a specific example for the second embodiment, $(YBa_2)Cu_3O_{6-8}X_{2-0.01}$ was used. In addition to the elements listed above, lanthanide elements and actinide elements can be used as A.

In this invention, a halogen element such as fluorine is added to the said oxide superconducting material in a concentration of 1/100% to 1/200% compared to the concentration of vacancies in the case in which none is added, to add heat-resistance and process-resistance.

In this invention, a halogen element such as fluorine is added to the oxide superconducting material in a concentration 1/100 to 200 % that of the vacancies. This produces a superconducting that is heat-resistant and process-resistant. In addition, to prevent the escape of more oxygen from the superconducting material, a deterioration prevention film or passivation film is also formed on the surface.

If the insulation coating has a thickness that permits the passage of a 5 to 50 Å tunnel current, another superconducting material can be laid on top of this insulating coating to form a Josephson element.

Also, the passivation film can be made in a thickness from 100 to 20,000 Å so that it also serves as a deterioration prevention coating.

In this invention, after a halogen element such as fluorine is added to the oxide superconducting material, the superconducting material together with the halogen is heat-treated in an inert gas, air or oxygen at 250° C. to 500° C. for example at 500° C., for 2 to 50 hours, for example for 5 hours. This heat treatment causes the fluorine that was added by ion injection, and, if any, the oxygen that was added in addition to the fluorine, to be set in a suitable atomic arrangement to form a stable superconducting surface. The reason for using a relatively low temperature is that escape of oxygen from the superconducting material and its replacement by fluorine set in the vacancies occurs easily at such relatively low temperature.

As a result, the surface oxygen concentration can be held at a suitable value when the super conducting material is maintained at liquid nitrogen temperature; that is to say, a passivation film can be produced.

This process has solved the problem of unreliability of oxide superconducting materials, with the superconductivity near the surface disappearing suddenly due to an unexplained cause. The surface remains stably superconducting for a long time.

By adding fluorine uniformly throught the material, including the interior, the superconductivity which it has previously acquired becomes fixed. The $T_{co}$ of the superconducting material becomes higher and it remains stable at a higher current density, which are important properties. Until now even though a high $T_{co}$ was obtained and a high current density was used, if the superconducting material was left in a vacuum and a large current allowed to continuously flow through it, it deteriorated. By adding a halogen element as in this invention in sufficient concentration to cancel the oxygen vacancies (1/100 to 200 % of the concentration of the vacancies), $T_{co}$ is stabilized. In addition, the electric current density can be raised to 1500A/cm$^2$ or more, up to three times that when halogen is not added.

As a result, a device which uses the surface, such as a Josephson element, gives stable and reliable operation for a long time.

This invention will now be explained with reference to the drawings.

EXAMPLE 1

FIG. 1 shows the manufacturing process of an example of this invention and the corresponding oxygen concentration distribution.

FIG. 1(A) shows $YBa_2Cu_3O_{6-8}$ as one example of an oxide superconducting material. The copper amount can be 3 or less. Such a superconducting material can have a monocrystalline or polycrystalline structure on a tablet or thin film; it is the starting material (FIG. 1 (A) (1)).

When this material is held in a vacuum device and the air evacuated, the oxygen escapes from near the surface (1'), causing deterioration of the electrical characteristics to a depth of about 200Å.

Figure 1D:
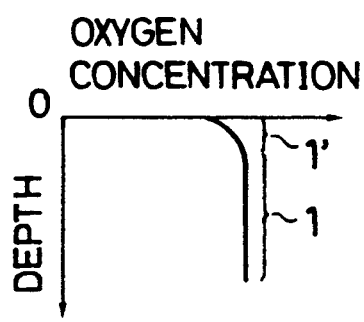

The oxygen concentration corresponding to FIG. 1(A) is shown in FIG. 1(D). In this figure, region (1) has normal oxygen concentration. Region (1') is short of oxygen. This depth depends on the type, structure and density of the superconducting material, but it varies from 50Å To 1000Å; in general it is about 200Å.

On top of the material, a silicon nitride layer 5Å to 50Å thick, for example 20Å thick, is formed by photo CVD wherein ultraviolet radiation or laser light is used so that a reactive gas is excited by the radiation, causing a coating to be formed on the surface. In addition, ion injection is carried out. The acceleration voltage is weak, 10 to 30KV; ions are added in such a manner that the oxygen concentration becomes fixed. Then the superconducting material is heat-treated at 350° C. for 2 hours. In this invention the voltage used to accelerate the fluorine, which is used as the halogen element, can be varied from 10 to 500KV, so that on the average the fluorine is added in a concentration 1/100 to 200 % that of the vacancies, for example $3 \times 10^{21} cm^{-3}$.

Figure 1E:
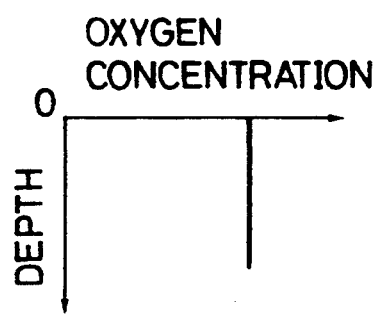

The superconducting material is then heat-treated in oxygen at 250° C. to 500° C., for example at 350° C, for about 30 minutes. As a result of this heat treatment, fluorine penetrates into oxygen vacancies in the interior, as shown in FIG. 1(E), making it hard for the perovskite structure of this oxide superconductor material to deteriorate.

The sample produced in a test of this example was removed from the heated condition and then stored in vacuum at 350° C. for 5 hours. The superconducting material with fluorine added had no oxygen deficiency and formed a device of high reliability.

An oxide superconducting material produced according to the method of this invention has micro-scale surface depressions on a scale observable under an electron microscope. These depressions have gaps in its interior. This causes the surface to appear very large. To make this surface become passive, fluorine, which is the most electrically negative halogen, is coated in a single layer or in dispersion. This is very effective in increasing the heat resistance. In addition, halogen can be added to fill the surface and interior oxygen vacancies. This procedure is very effective in simplifying the superconducting material production process.

In a test of this process, the oxide superconducting material with fluorine added was left in a vacuum at 300° C. for 5 hours. A coating with fluorine added according to the method of this invention kept stable superconductivity with a $T_{co}$ of 79° K. Under the same conditions, however, an oxide superconducting material to which fluorine had not been added lost its superconductivity completely.

In describing this invention, the term "oxide superconducting material" has been used. It is clear technological concept of this invention that this material can have either a menocrystalline or polycrystalline structure.

In the example of this invention that was described, fluorine was used as the halogen element. However, iodine or bromine could also be added.

In the previous example, after the coating is formed, oxygen is injected into the superconducting material by ion injection. It is also effective to first inject oxygen by ion injection into the surface and immediate vicinity of the surface of the superconducting material, then fort the coating, then use heat treatment to cause the added oxygen to assume the correct atomic arrangement to make the material superconducting.

In describing the previous example, fluorine is added to a previously formed material. However since the usual way of producing this superconducting material uses finely-grained yttrium oxide, barium carbonate and copper oxide which are repeatedly blended and fired, then formed into a tablet, and if a thin film is to be formed, this tablet is used as a target for sputtering to form the thin film on a mold, any or all of $YF_3$, $YbF_3$, $TbF_3$ and $LaF_3$ can be added to the original materials to be blended as a means of adding fluorine. The corresponding chlorides or bromides could be used in place of these fluorides.

However, since the basic concept of this invention is to first produce oxygen vacancies in the superconducting material at whatever temperature is required to produce them, then to which a halogen element is added to fill them, it is desirable to add the halogen after first forming the oxide superconductor material so as to increase $T_{co}$.

EXAMPLE 2

Figure 2:
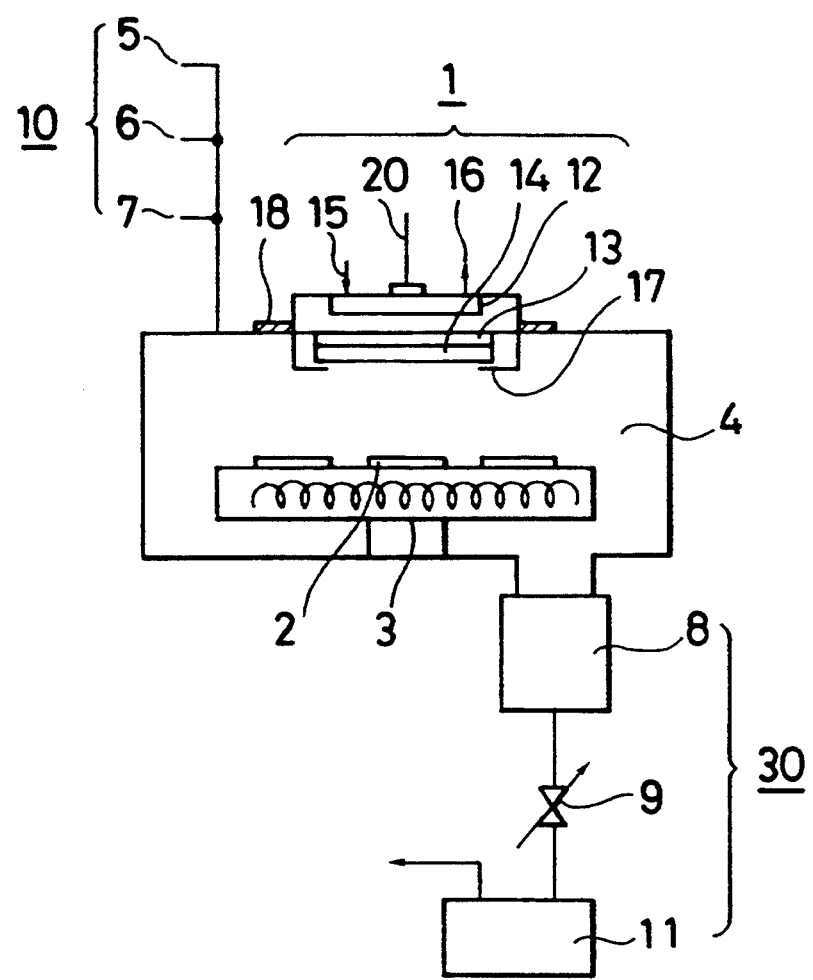
FIG. 2 shows a diagram of a sputtering system used in the present invention.

FIG. 2 shows an outline of a sputtering device that is used to produce the superconducting material of this invention.

In FIG. 2, there are a target (1), a reaction chamber (4), a doping system (10) and an exhaust system (30).

Argon (5), oxygen (6) and a halogen-containing gas (7) are introduced into the doping system. Here nitrogen fluoride ($NF_3$) is used for the halogen-containing gas (7). The exhaust system (30) has a turbo pump (8), pressure adjusting valve (9), and rotary pump (11). The substrate (2) is laid on a holder (3), which also surves as a heater, and is heated from room temperature up to a maximum of 900° C.

While the film is being formed the temperature is kept between 400° C. and 900° C., for example at 750° C. The target (1) and substrate (2) are 2cm to 15cm from the surface to be coated.

The target (1) is made of an oxide superconducting material which has the formula $(A_{1-x}B_x)_y Cu_z O_w X_v$, where x is 0 to 1.0, y is 2.0 to 4.0, z is 1.0 to 4.0, w is 4.0 to 8.0 and v is 0 to 3.0, and is pressed. The rear surface of this so-called target (12) has a packing plate (13), a magnet (14), a cooling water inlet (15), a cooling water outlet (16) and a shield plate (17). These are electrically isolated from the main body of the sputering device by a teflon insulater (18). A large negative voltage with respect to this target (1) is applied to the electric current input terminal (20).

When DC (direct current) sputtering is used, negative voltage is applied to this target and the substrate is grounded.

When AC sputtering is used, the substrate is electrically floated.

EXPERIMENT 1

$YBa_2Cu_3O_{6 \text{ to } 8}$ is used as the target (12). The target and the substrate are 10cm apart. The argon partial pressure is $4 \times 10^{-1}$Pa, the oxygen partial pressure $5 \times 10^{-3}$Pa and the $NF_3$ partial pressure $8 \times 10^{-4}$Pa. The DC sputtering output is 500W, 1KW. This target has a diameter of 20cm. The substrate (2) is in a holder (3) which is heated to 750° C. and rotated so that it becomes uniform in thickness. It is then slowly cooled to a temperature between 250° C. and 500° C. at which it is held for eight hours to deform the crystal structure in the film. In this experiment we were able to produce an oxide superconducting material.

When $NF_3$ was not introduced at all in this experiment, $T_{co}$ was only 83° K. From this we conclude that when flourine, which is a halogen element, is added to the film, and then the film is slowly heated (heat annealed), fluorine is added at positions where there would otherwise be oxygen vacancies, thus stabilizing the structure and greatly increasing $T_{co}$. If the heat annealing is not done, there are cases in which superconductivity is not observed at all.

EXPERIMENT 2

$Y_{0.5}Yb_{0.5}Ba_2Cu_3O_{6\ to\ 8}X_{2\ to\ 0.01}$ was used as the target. In this case, fluorine had already been added as X. The argon pressure was $4\times10^{-1}$Pa; neither oxygen nor $NF_5$ was added. The film produced (thickness 2 micrometers) was heat annealed at 300° C. for 5 hours in air. As a result, the superconducting material which formed on the surface had 600A/minute.

In the present invention, another type of ceramic compositions can be used for the superconducting ceramic material.

Specifically, the superconducting ceramic material for use in accordance with the present invention may be prepared consistent with the stoichiometric formula $(A_{1-x}B_x)_yCu_zO_w$, where A is one or more elements of Group IIIa of the periodic Table, e.g. the rare earth elements; B is one or more elements of Group, IIa of the Periodic Table, e.g. the alkaline earth metals including beryllium and magnesium, and X=0 to 1; y=2.0 to 4.0, preferably 2.5 to 3.5; z=1.0 to 4.0, preferably 1.5 to 3.5; z=1.0 to 4.0, preferably 1.5 to 3.5; and w=4.0 to 10.0, preferably 6.0 to 8.0. Also, superconducting ceramics for use in accordance with the present invention may be prepared consistent with the stoichiometric formula $A_{1-x}B_x)_yCu_zO_w$, where A is one ore more elements of Group Vb of the Periodic Table such as Bi, Sb and As; B is one or more elements of Group IIa of the of the Periodic Table, e.g. the alkaline earth metals including beryllium and magnesium, and x=0 to 1; y=2.0 to 4.0, preferably 2.5 to 3.5; z=1.0 to 4.0, preferably 1.5 to 3.5; and w=4.0 to 10.0, preferably 6.0 to 8.0. One example of the former formula is $YBa_2Cu_3O_x$(x=6 to 8) and examples of $BiSrCaCu_2O_x$ and $Bi_4Sr_3Ca_3Cu_4O_x$. In addition the composition $Bi_4(Sr_yCa_2)Cu_4O_x$ is possible for such purposes and its Tc is 40 to 60 when the value of y is about 1.5. The Tc onset and Tco of the composition. $Bi_4Sr_4Ca_2Cu_4O_x$ are 110° K. and 79° K., respectively. The value of x in the above formula is estimated to be 6 to 10, for example about 8.1.

The stoichiometric formulae mentioned above can be determined for example by X-ray diffraction.

What is claimed is:

1. A method of forming a copper oxide superconducting material comprising the steps of:
   forming a copper oxide superconducting material having a superconducting molecular structure; and
   adding a halogen into said copper oxide superconducting material by heat diffusion after the formation of said copper oxide superconducting material.

2. The method of claim 1, further comprising the step of annealing said superconducting material.

3. The method of claim 1, wherein said halogen is added at a concentration of 1/100% to 200% of oxygen vacancies.

4. The method of claim 1, wherein said superconducting material is single or polycrystalline.

5. The method of claim 1 wherein said halogen element is selected from the group consisting of fluorine, iodine and bromine.

6. The method of claim 1 further comprising the step of forming a passivation film on said copper oxide superconducting material either before of after adding said halogen element.

7. The method of claim 6 wherein said passivation film comprises a material selected from the group consisting of silicon nitride, aluminum nitride, aluminum oxide, tantalum oxide, titanium oxide, copper oxide, barium oxide and yttrium oxide.

8. A method of forming an oxide superconducting material comprising:
   preparing a copper oxide superconducting material having a superconducting molecular structure; and
   adding a halogen element into said copper oxide superconducting material by ion injection after the formation of said copper oxide superconducting material.

9. The method of claim 8, further comprising the step of thermal annealing said superconducting material.

10. The method of claim 8, wherein said halogen is fluorine.

11. The method of claim 8 wherein said halogen element is selected from the group consisting of fluorine, iodine and bromine.

12. The method of claim 8 further comprising the step of forming a passivation film on said copper oxide superconducting material either before of after adding said halogen element.

13. The method of claim 12 wherein said passivation film comprises a material selected from the group consisting of silicon nitride, aluminum nitride, aluminum oxide, tantalum oxide, titanium oxide, copper oxide, barium oxide and yttrium oxide.

14. A method of forming a copper oxide superconducting material comprising the steps of:
   forming a copper oxide superconducting material having a superconducting molecular structure; and
   adding a halogen element into said copper oxide superconducting material by heat diffusion or ion injection after forming said copper oxide superconducting material in order to set a suitable atomic arrangement, wherein said copper oxide superconducting material is $(A_{1-x}B_x)_yCu_zO_wX_v$,
   where A is one or more elements selected from Group IIa of the periodic table, B is one or more elements of alkaline metals, X is said halogen element and x=0–1.0, y=2.0 –4.0, z=1.0–4.0, w=4.0–8.0 and v=0.01 to 3.0.

15. The method of claim 14, further comprising the step of annealing said superconducting material.

16. The method of claim 14, wherein said halogen is added at a concentration of 1/100% to 200% of oxygen vacancies.

17. The method of claim 14, wherein said superconducting material is single or polycrystalline.

18. The method of claim 14 wherein said halogen element is selected from the group consisting of fluorine, iodine and bromine.

19. The method of claim 14 further comprising the step of forming a passivation film on said copper oxide superconducting material either before of after adding said halogen element.

20. The method of claim 19 wherein said passivation film comprises a material selected from the group consisting of silicon nitride, aluminum nitride, aluminum oxide, tantalum oxide, titanium oxide, copper oxide, barium oxide and yttrium oxide.

* * * * *